United States Patent
Andrews et al.

(10) Patent No.: US 6,635,503 B2
(45) Date of Patent: Oct. 21, 2003

(54) CLUSTER PACKAGING OF LIGHT EMITTING DIODES

(75) Inventors: Peter S. Andrews, Greensboro, NC (US); David B. Slater, Jr., Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/058,369

(22) Filed: Jan. 28, 2002

(65) Prior Publication Data

US 2003/0143767 A1 Jul. 31, 2003

(51) Int. Cl.7 ............................................. H01L 21/00
(52) U.S. Cl. .................................. 438/27; 20/22; 20/28
(58) Field of Search ............................ 438/27, 28, 29, 438/20, 22; 257/79, 80, 88

(56) References Cited

U.S. PATENT DOCUMENTS

| | | | |
|---|---|---|---|
| 4,396,929 A | | 8/1983 | Ohki et al. ................... 29/161 |
| 4,476,620 A | * | 10/1984 | Ohki et al. ................... 29/569 |
| 4,966,862 A | * | 10/1990 | Edmond ....................... 438/27 |
| 5,006,908 A | | 4/1991 | Matsuoka et al. ............ 357/17 |
| 5,087,949 A | | 2/1992 | Haitz .......................... 357/17 |
| 5,187,547 A | | 2/1993 | Niina et al. .................. 257/77 |
| 5,210,051 A | | 5/1993 | Carter, Jr. .................. 437/107 |
| 5,247,533 A | | 9/1993 | Okazaki et al. .............. 372/45 |
| 5,393,993 A | | 2/1995 | Edmond et al. ............. 257/77 |
| 5,416,342 A | | 5/1995 | Edmond et al. ............. 257/76 |
| 5,523,589 A | | 6/1996 | Edmond et al. ............. 257/77 |
| 5,718,760 A | | 2/1998 | Carter et al. ................. 117/84 |
| 5,767,581 A | | 6/1998 | Nakamura et al. .......... 257/749 |
| 5,779,924 A | | 7/1998 | Krames et al. ............... 216/24 |
| 5,912,477 A | | 6/1999 | Negley ......................... 257/95 |
| 5,917,202 A | | 6/1999 | Haitz et al. .................. 257/98 |
| 5,952,681 A | | 9/1999 | Chen ........................... 257/89 |
| 6,033,927 A | * | 3/2000 | Shibata et al. ............... 438/33 |
| 6,046,465 A | | 4/2000 | Wang et al. .................. 257/98 |
| 6,091,085 A | | 7/2000 | Lester .......................... 257/98 |
| 6,097,041 A | | 8/2000 | Lin et al. ..................... 257/98 |
| 6,121,636 A | | 9/2000 | Morita et al. ................ 257/99 |
| 6,121,637 A | | 9/2000 | Isokawa et al. .............. 257/99 |
| 6,133,589 A | | 10/2000 | Krames et al. ............. 257/103 |
| 6,169,294 B1 | | 1/2001 | Biing-Jye et al. ............. 257/79 |

(List continued on next page.)

FOREIGN PATENT DOCUMENTS

| | | |
|---|---|---|
| EP | 0 961 328 A2 | 12/1999 |
| EP | 0961328 A2 * | 12/1999 |
| GB | 2 346 480 A | 8/2000 |
| JP | 56131977 | 10/1981 |
| JP | 1225377 | 9/1989 |
| JP | 9082587 | 3/1997 |
| JP | 10256604 | 9/1998 |
| JP | 195827 | 7/2000 |

OTHER PUBLICATIONS

*OSRAM Enhances Brightness of Blue InGaN LEDs*, Compound Semiconductor, vol. 7, No. 1, Feb. 2001, p. 7.

(List continued on next page.)

*Primary Examiner*—David Nelms
*Assistant Examiner*—Thao Le
(74) *Attorney, Agent, or Firm*—Myers Bigel Sibley & Sajovec, P.A.

(57) ABSTRACT

Methods of forming a light emitting diode are provided by scoring a semiconductor substrate having a light emitting region formed thereon so as to provide score lines between individual ones of a plurality of light emitting diodes. The semiconductor substrate is then broken along selected ones of the score lines so as to provide a unitized subset of the plurality of light emitting diodes. The unitized subset includes at least two light emitting diodes. Electrical connections are provided to the light emitting diodes of the unitized subset of the plurality of light emitting diodes. The score lines may also define the individual ones of the light emitting diodes.

20 Claims, 3 Drawing Sheets

U.S. PATENT DOCUMENTS

| | | | |
|---|---|---|---|
| 6,177,688 B1 | 1/2001 | Linthicum et al. | 257/77 |
| 6,187,615 B1 * | 2/2001 | Kim et al. | 438/113 |
| 6,194,743 B1 | 2/2001 | Kondoh et al. | 257/94 |
| 6,222,207 B1 | 4/2001 | Carter-Coman et al. | 257/98 |
| 6,229,120 B1 | 5/2001 | Krames et al. | 257/94 |

OTHER PUBLICATIONS

Craford, *Outlook for AlInGaP Technology*, Presentation, Strategies in Light 2000.

Krames et al., *High–Power Truncated–Inverted–Pyramid $(Al_xGa_{1-x})_{0.5}In_{0.5}P/GaP$ Light–Emitting Diodes Exhibiting >50 External Quantum Efficiency*, Applied Physics Letters, vol. 75, No. 16, Oct. 18, 1999, pp. 2365–2367.

Lambrecht et al., *Brand Structure Interpretation of the Optical Transitions Between Low–Lying Conduction Bands in n–Type Doped SiC Polytypes*, Materials Science Forum, vols. 264–268, 1998, pp. 271–274.

Craford, *Overview of Device Issues in High–Brightness Light–Emitting Diodes*, Chapter 2, *High Brightness Light Emitting Diodes: Semiconductors and Semimetals*, vol. 48, Stringfellow et al., Academic Press, 1997, pp. 47–63.

Yoo et al., *Bulk Crystal Growth of 6H–SiC on PolytypeControlled Substrates Through Vapor Phase and Characterization*, Journal of Crystal Growth, vol. 115, vol. 1991, pp. 733–739.

Biederman, *The Optical Absorption Bands and Their Anisotrophy in the Various Modifications of SiC*, Solid State Communications, vol. 3, 1965, pp. 343–346.

U.S. application Ser. No. 09/154,363, entitled *Vertical Geometry InGaN LED*.

* cited by examiner

CLUSTER PACKAGING OF LIGHT EMITTING DIODES

FIELD OF THE INVENTION

The present invention relates to microelectronic devices and more particularly to light emitting diodes.

BACKGROUND OF THE INVENTION

Light emitting diodes (LEDs) are widely used in consumer and commercial applications. As is well known to those having skill in the art, a light emitting diode generally includes a diode region on a microelectronic substrate. The microelectronic substrate may comprise, for example, gallium arsenide, gallium phosphide, alloys thereof, silicon carbide and/or sapphire. Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent and fluorescent lamps.

To increase the output of LEDs, several approaches have been utilized. Two such approaches include increasing the size of the LEDs and connecting multiple discrete LEDs in parallel. Increasing the size of the LEDs may provide increased output by increasing the light emitting area of the LED. However, as size increases, yields typically decrease. Furthermore, light extraction may be more difficult as the size of the LED increases. Thus, increasing the size of the LED may increase the cost of the LED in relation to the amount of light produced by the LED.

Providing multiple discrete LEDs which have been individually tested and interconnected may overcome the yield issues of increased size LEDs as well as problems with extraction of light from the LEDs. However, individually testing, matching and/or interconnecting the multiple LEDs may increase the cost of the product.

SUMMARY OF THE INVENTION

Embodiments of the present invention provide methods of forming a light emitting diode by scoring a semiconductor substrate having a light emitting region formed thereon so as to provide score lines between individual ones of a plurality of light emitting diodes. The semiconductor substrate is then separated along selected ones of the score lines so as to provide a unitized subset of the plurality of light emitting diodes. The unitized subset includes at least two light emitting diodes. Electrical connections are provided to the light emitting diodes of the unitized subset of the plurality of light emitting diodes.

In further embodiments of the present invention, the score lines define individual ones of the plurality of light emitting diodes.

In particular embodiments of the present invention, the semiconductor substrate comprises a silicon carbide substrate. Alternatively, the semiconductor substrate may be a sapphire substrate.

In still further embodiments of the present invention, the selected ones of the score lines along which the semiconductor substrate is broken are score lines that provide a strip of light emitting diodes. Furthermore, the selected ones of the score lines along which the semiconductor substrate is broken may be score lines that provide a rectangle of light emitting diodes having at least two parallel rows of light emitting diodes. Similarly, the selected ones of the score lines along which the semiconductor substrate is broken may be score lines that provide a square of light emitting diodes.

Additionally, electrical connections may be provided by soldering to contacts of the light emitting diodes. The light emitting diodes may have a common contact for each of the light emitting diodes in the unitized subset and individual contacts corresponding to each of the light emitting diodes in the unitized subset. In such embodiments, electrical connections may be provided by providing a common connection for the common contact and providing a series-parallel connection of the individual contacts. The common connection may be provided by soldering a connection to the common contact. The parallel connection may be provided by connecting each of the individual contacts to a conducting bus strip. Such a parallel connection may also be provided by connecting a first of the individual contacts to a conducting bus and daisy-chaining remaining ones of the individual contacts to the first of the individual contacts.

In additional embodiments of the present invention, the selected ones of the score lines along which the semiconductor substrate is broken are score lines selected to provide a unitized subset of light emitting diodes that provided a selected wavelength profile. The selected wavelength profile may be a selected range of wavelengths.

In other embodiments of the present invention, the selected ones of the score lines along which the semiconductor substrate is broken are score lines selected to provide a unitized subset of light emitting diodes that provided a selected light output level.

In additional embodiments of the present invention, the score lines provide an ATON shape to each of the light emitting diodes.

In still further embodiments of the present invention, electrical connections to light emitting diodes of the unitized subset of the plurality of light emitting diodes are provided to selectively connect the light emitting diodes of the unitized subset of the plurality of light emitting diodes so as to provide a set of light emitting diodes having a predefined characteristic. The predefined characteristic may be a light output characteristic and/or an electrical characteristic, such as a forward bias voltage.

DETAILED DESCRIPTION OF THE INVENTION

The present invention will now be described with reference to the FIGS. 1 through 4, which illustrate various embodiments of the present invention. As illustrated in the Figures, the sizes of layers or regions are exaggerated for illustrative purposes and, thus, are provided to illustrate the general structures of the present invention. Furthermore, various aspects of the present invention are described with reference to a layer being formed on a substrate or other layer. As will be appreciated by those of skill in the art, references to a layer being formed on another layer or substrate contemplates that additional layers may intervene. References to a layer being formed on another layer or substrate without an intervening layer are described herein as being formed "directly" on the layer or substrate. Like numbers refer to like elements throughout.

Figure 1:
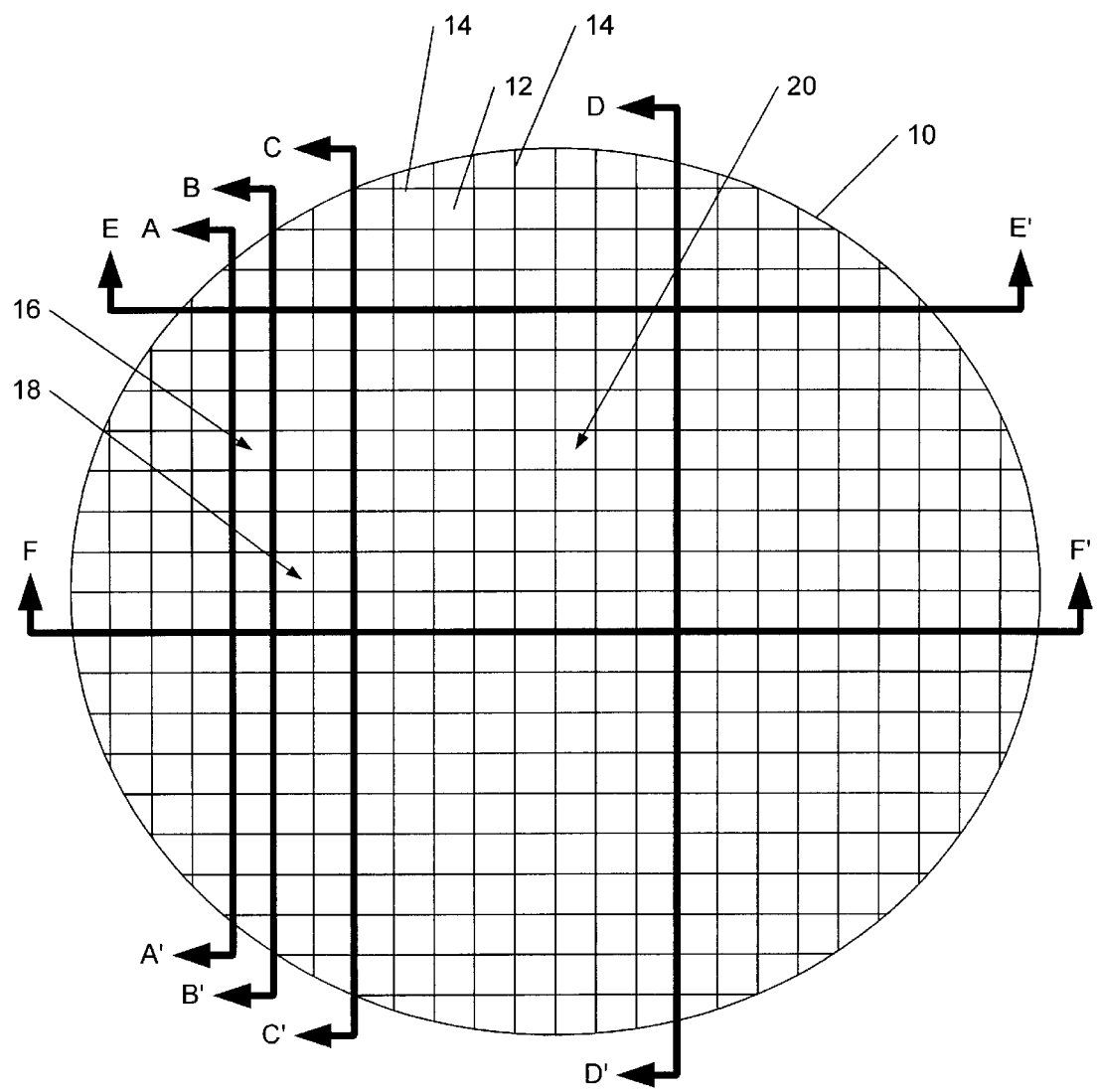
FIG. 1 is a top view of a scored semiconductor substrate prior to breaking according to embodiments of the present invention.

FIGS. 1 through 4 illustrate various embodiments of the present invention and various processes of fabricating light emitting devices according to embodiments of the present invention. As seen in FIG. 1, a wafer 10, such as a silicon carbide or sapphire wafer, has formed thereon a plurality of light emitting devices 12, such as light emitting diodes. The periphery of each of the light emitting devices 12 is defined by a plurality of score lines 14. The score lines 14 may, for example, be provided by sawing and/or etching the wafer 10 so as to provide grooves in the wafer 10 along which the wafer 10 may be separated. For example, with a silicon carbide substrate, the score lines may extend into the substrate to a depth which results in from about 20 to about 25 $\mu$m of the device structure remaining. The light emitting devices 12 may have a common light emitting region formed on the wafer 10 or may be discrete devices, such as individual devices isolated by mesas, guard rings, implanted regions, or the like, formed on and/or in the wafer 10 and/or in a layer formed on the wafer 10.

Alternatively, score lines which, for example, leave about 30 to 40 $\mu$m of the device structure remaining may be utilized for light extraction which score lines which result in from about 20 to about 25 $\mu$m of the device structure remaining utilized where the wafer is to be broken. Such may be accomplished by, for example, selecting the relatively contiguous devices and determining where the device array boundaries are located. Such a determination could then be used to change the cut height of the saw forming the score lines. By altering the thickness for score lines along a break and score lines provided to differentiate devices and for light output, the likelihood of inadvertently breaking the wafer along an incorrect score line may be reduced.

According to embodiments of the present invention, the wafer 10 is selectively separated along score lines 14, which are selected so as to provide a unitized subset of light emitting devices 12. Thus, for example, the wafer 10 may be broken along score lines A—A', B—B', E—E' and F—F' to provide a unitized subset 16 of the light emitting devices 12 that provides a linear array of 8 light emitting devices. Similarly, the wafer 10 may be broken along score lines B—B', C—C', E—E' and F—F' to provide a unitized subset 18 of the light emitting devices 12 that provides a 2×8 rectangular array of light emitting devices. As is further illustrated in FIG. 1, the wafer 10 may be broken along score lines C—C', D—D', E—E' and F—F' to provide a unitized subset 20 of the light emitting devices 12 that provides an 8×8 square array of light emitting devices.

While the light emitting devices 12 in FIG. 1 are illustrated as substantially square in shape, other shapes of light emitting devices may be provided by rearranging and/or adding score lines 14. For example, triangular light emitting diodes may be provided by further scoring the wafer 10 to further divide the light emitting devices 12. Similarly, combinations of different shaped light emitting diodes may also be provided by rearranging and/or adding score lines 14. Thus, for example, rectangular and triangular devices may be provided in a single wafer. Similarly, different polygonal devices may also be provided in a single wafer. Additionally, different shapes, such as arcs, curves or the like may be provided by the score lines such that any resulting shape may be provided by separation along selected score lines. However, the particular technique of separation may limit the practicality of certain shapes. The particular type and/or combination of types of devices in a unitized subset of the devices may then be determined by the selection of the score lines along which the wafer 10 is broken.

The selective breaking or not breaking of wafer 10 along the score lines of the wafer 10 which define the light emitting diodes may be utilized with many different types of light emitting devices. Embodiments of the present invention may be particularly well suited for use with the light emitting diodes described in U.S. patent application Ser. No. 10/057,821 entitled "LIGHT EMITTING DIODES INCLUDING SUBSTRATE MODIFICATIONS FOR LIGHT EXTRACTION AND MANUFACTURING METHODS THEREFOR" filed Jan. 25, 2002, the disclosure of which is incorporated herein by reference as if set forth fully herein.

Figure 2:
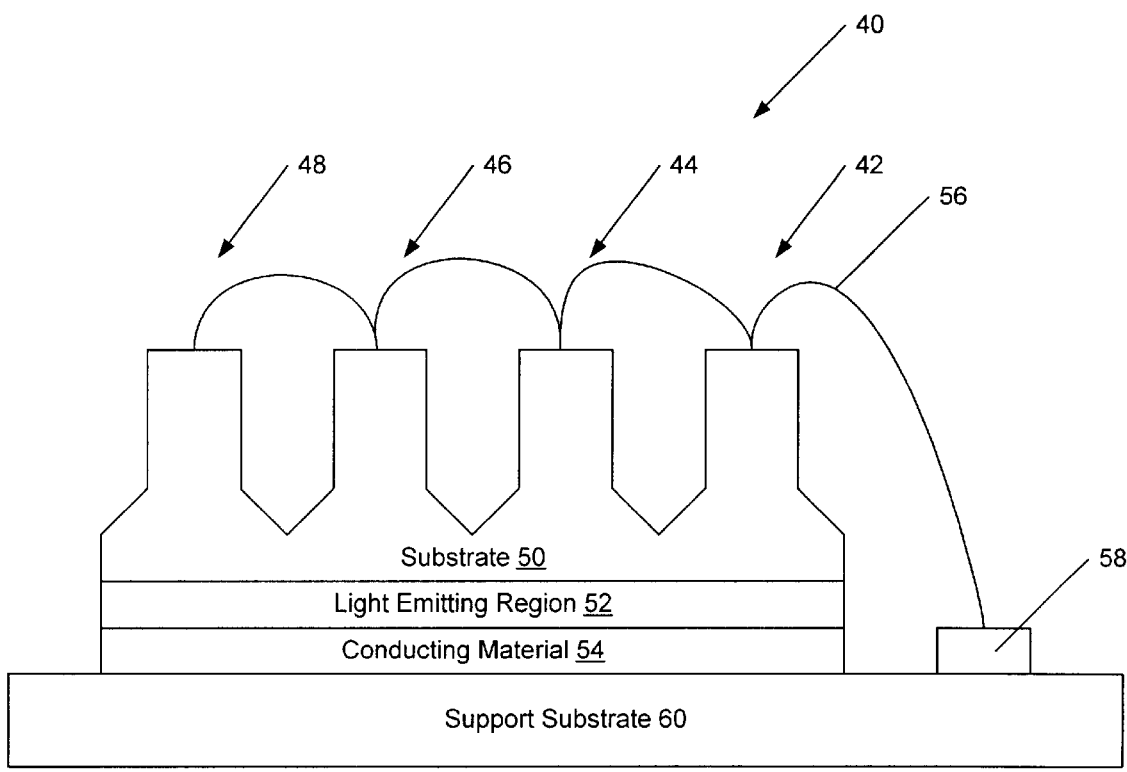
FIG. 2 is a side view of a unitized subset of a plurality of light emitting diodes according to embodiments of the present invention.

FIG. 2 illustrates an interconnection of a unitized subset of light emitting diodes according to embodiments of the present invention. The unitized subset of light emitting diodes 40 include a substrate 50 having a light emitting region 52 formed thereon. The light emitting diodes 42, 44, 46 and 48 of the unitized subset of light emitting diodes 40 may have the ATON shape illustrated in FIG. 2, which may be provided by the score lines, or may have other shapes or combinations of shapes. A conducting material 54 on a support substrate 60 provides electrical contact to a contact region and/or regions of the unitized subset of light emitting diodes 40. The conducting material 54 may be solder, a eutectic bond and/or conductive epoxy. The support substrate 60 has a conducting region 58 thereon, such as a metallic land and/or bus, to which a second contact and/or contacts of the unitized subset of light emitting diodes 40 is electrically connected by the conductor 56.

Figure 3:
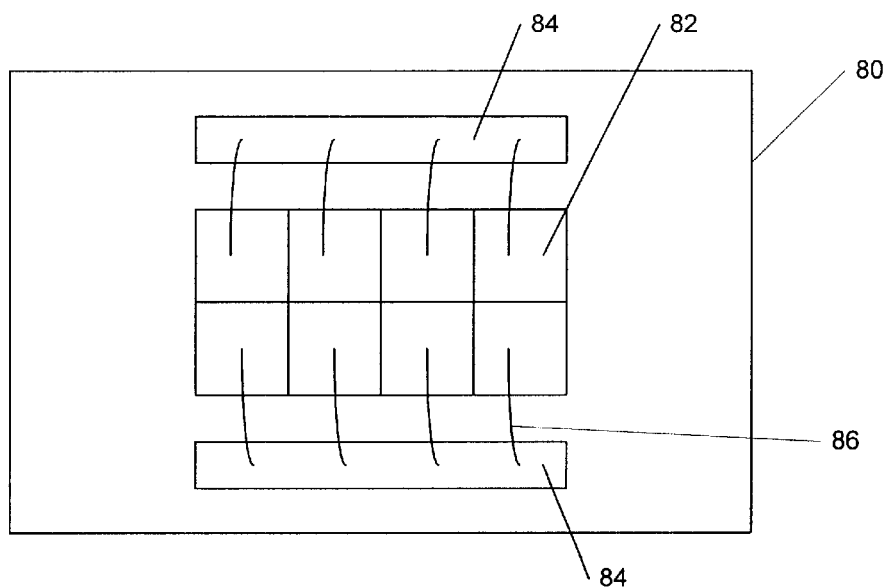
FIG. 3 is a top view of interconnected light emitting diodes according to embodiments of the present invention.

The conductor 56 may be connected to the unitized subset of light emitting diodes 40 by solder. However, other conductive connections may also be provided, such as a eutectic bond and/or conductive epoxy. Furthermore, the light emitting diodes 42, 44, 46 and 48 in the unitized subset of light emitting diodes 40 may be individually connected to the conducting region 84 (e.g. as illustrated in FIG. 3) or may be daisy-chained together by the conductor 56 and then connected to the conducting region 58 (e.g. as illustrated in FIG. 2). Combinations of daisy-chained contacts and individual connections to the conducting region 58, 84 may also be provided.

While the embodiments of the present invention illustrated in FIG. 2 are described with reference to a "flip-chip" configuration, where light is extracted through the substrate 50, and with reference to light emitting diodes having contacts on opposite sides of the device, as will be appreciated by those of skill in the art in light of the present disclosure, other configurations may also be utilized while still benefiting from the teachings of the present invention. For example, devices with both contacts on the same side of the device may be utilized. Furthermore, devices which are not of the "flip-chip" configuration may also be utilized. Additionally, while FIG. 2 illustrates the unitized subset of light emitting diodes being mounted on a support substrate 60, such a support substrate may be omitted.

Turning to FIG. 3, a top view of an interconnection of a 2×4 unitized subset of light emitting diodes 82 is illustrated. As seen in FIG. 3, the unitized subset of light emitting diodes 82 is mounted on a support substrate 80. Contacts of the light emitting diodes of the unitized subset of light emitting diodes 82 are connected to the conducting regions 84 of the support substrate 80 so as to provide electrical connection to the light emitting diodes. The second contact of the light emitting diodes may be made to the opposite side of the light emitting diodes and may be made directly to the support substrate 80 by, for example, a soldering process.

While the contacts of the light emitting diodes are illustrated as on opposite faces of the light emitting diodes in FIG. 3, both contacts on a common face of the light emitting diodes may also be provided. In such a case, direct electrical connections from the support substrate 80 may be provided by, for example, selective solder connections, eutectic bonds and/or conductive epoxy. Alternatively, conductors could be connected to both contacts if the contacts were on a face of the light emitting diodes opposite the support substrate 80.

Figure 4:
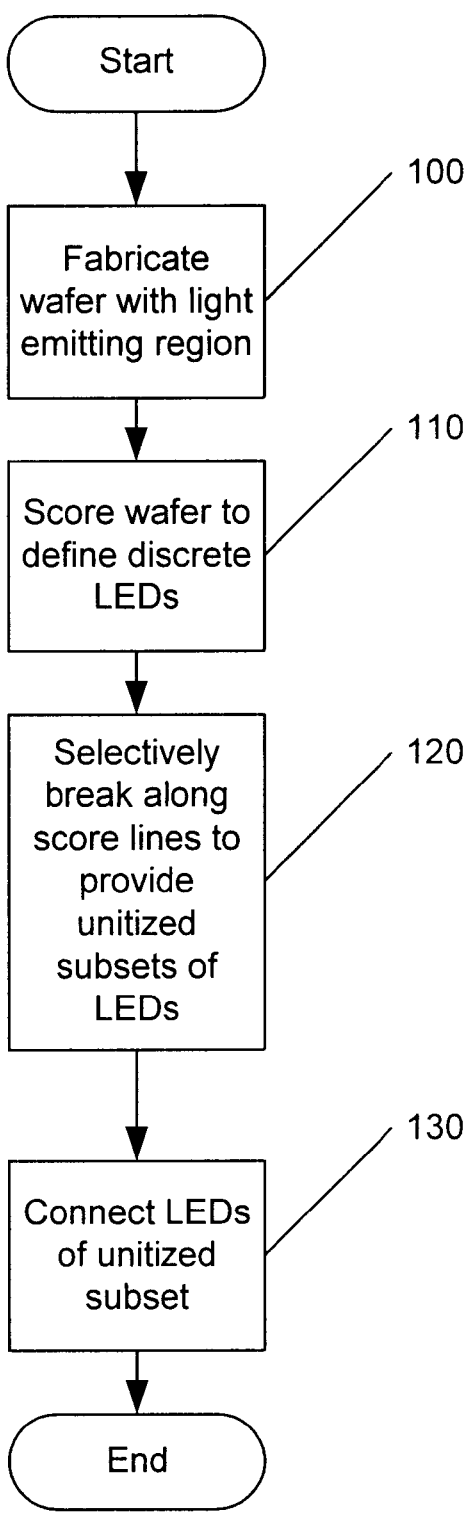
FIG. 4 is a flowchart illustrating operations according to embodiments of the present invention.

FIG. 4 illustrates operations according to embodiments of the present invention. As seen in FIG. 4, a wafer with a light emitting region and/or regions is fabricated (block 100). The wafer is then scored to define discrete light emitting diodes (block 110). This scoring process may produce any desired shape to the periphery of the light emitting diodes and may be carried out, for example, by sawing and/or etching the wafer to provide the score lines. The scoring of the wafer is sufficiently deep so as to allow the wafer to be broken along the score lines. The wafer is then broken along selected ones of the score lines to provide a unitized subset of the light emitting diodes having two or more diodes contained therein (block 120).

The selected score lines may be selected based on one or more criteria. For example, the score lines may be selected to provide a desired number of diodes in the unitized subset of light emitting diodes. The score lines may also be selected to provide a unitized subset of diodes having a desired optical and/or electrical property or properties. For example, the score lines could be selected to provide diodes with a desired light output level, wavelength and/or wavelengths. The score lines may also be selected to provide a desired wavelength profile, such as a range of wavelengths. Similarly, the score lines could be selected to provide a unitized subset of light emitting diodes with a desired electrical characteristic, such as forward bias voltage $V_f$. Such a selection may be made based on actual measurements of the light emitting diodes on the wafer or may be made based on predicted characteristics of the light emitting diodes. Similarly, light emitting diodes within a wafer may be designed to have differing characteristics, such as output wavelength. In such a case, the score lines could be selected to provide a desired combination of light emitting diodes having the differing characteristics.

After breaking the wafer to provide the unitized subset of light emitting diodes, connections are made to the light emitting diodes of the unitized subset of light emitting diodes (block 130). Preferably, such connections are made using solder technology, however, eutectic bonds and/or conductive epoxy may also be used. Furthermore, preferably, the light emitting diodes have connections on opposite faces of a substrate and are utilized in a "flip-chip" configuration with light extracted through the substrate. In such embodiments, a silicon carbide substrate is preferred.

While embodiments of the present invention have primarily been described herein as being separated into unitized subsets of light emitting diodes through breaking, as will be appreciated by those of skill in the art in light of the present disclosure, other methods for separating the subset of light emitting devices may be utilized. For example, the subsets may be separated by sawing, laser cutting, water jet milling or other such techniques conventionally utilized for singulation of individual dies.

Similarly, while embodiments of the present invention have primarily been described with reference to each of the light emitting diodes in the unitized subset of light emitting diodes having electrical connections provided thereto, the present invention should not be construed as limited to such embodiments. In other embodiments of the present invention, selected ones of light emitting diodes of the unitized subset, which may be all or less than all of the light emitting diodes, may be have connections provided. As described above, the light emitting diodes having connections provided may be selected to provide a particular characteristic, such as wavelength or range of wavelengths, voltage characteristic and/or output level or the like. Such selected light emitting diodes may have connections provided as described above. Such a selective interconnection may be provided, for example, as described in commonly assigned U.S. patent application Ser. No. 09/981,523, entitled "LARGE AREA SILICON CARBIDE DEVICES AND MANUFACTURING METHODS THEREFOR" which was filed Oct. 17,2001, the disclosure of which is incorporated herein by reference as if set forth fully herein.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a light emitting diode, comprising:

scoring a semiconductor substrate having a light emitting region formed thereon so as to provide score lines between individual ones of a plurality of light emitting diodes; then separating the semiconductor substrate along selected ones of the score lines so as to provide a unitized subset of the plurality of light emitting diodes, the unitized subset including at least two light emitting diodes; and providing electrical connections to light emitting diodes of the unitized subset of the plurality of light emitting diodes.

2. The method of claim 1, wherein the semiconductor substrate comprises a silicon carbide substrate.

3. The method of claim 1, wherein the semiconductor substrate comprises a sapphire substrate.

4. The method of claim 1, wherein the selected ones of the score lines along which the semiconductor substrate is separated comprise score lines selected to provide a strip of light emitting diodes as the unitized subset.

5. The method of claim 1, wherein the selected ones of the score lines along which the semiconductor substrate is separated comprise score lines selected to provide a rectangle of light emitting diodes having at least two parallel rows of light emitting diodes as the unitized subset.

6. The method of claim 1, wherein the selected ones of the score lines along which the semiconductor substrate is separated comprise score lines selected provide a square of light emitting diodes as the unitized subset.

7. The method of claim 1, wherein the step of providing electrical connections comprises the step of soldering to contacts of the light emitting diodes.

8. The method of claim 1, wherein the plurality of light emitting diodes of the unitized subset of light emitting diodes have a common contact for each of the light emitting diodes in the unitized subset and individual contacts corresponding to each of the light emitting diodes in the unitized subset, and wherein the step of providing electrical connections comprises the steps of:

provide a common connection for the common contact; and providing parallel connection of the individual contacts.

9. The method of claim 8, wherein the step of providing a common connection comprises the step of soldering a connection to the common contact.

10. The method of claim 8, wherein the step of providing parallel connection comprises the step of connecting ones of the individual contacts to a conducting bus strip.

11. The method of claim 8, wherein the step of providing parallel connection comprises the steps of:

connecting a first of the individual contacts to a conducting bus; and daisy-chaining remaining ones of the individual contacts to the first of the individual contacts.

12. The method of claim 1, wherein the selected ones of the score lines along which the semiconductor substrate is separated comprise score lines selected to provide a unitized subset of light emitting diodes that provided a selected wavelength profile.

13. The method of claim 12, wherein the selected wavelength profile comprises a selected range of wavelengths.

14. The method of claim 1, wherein the selected ones of the score lines along which the semiconductor substrate is separated comprise score lines selected to provide a unitized subset of light emitting diodes that provided a selected light output level.

15. The method of claim 1, wherein the score lines provide an ATON shape to ones of the light emitting diodes.

16. The method of claim 1, wherein the step of providing electrical connections to light emitting diodes of the unitized subset of the plurality of light emitting diodes comprises selectively connecting the light emitting diodes of the unitized subset of the plurality of light emitting diodes so as to provide a set of light emitting diodes having a predefined characteristic.

17. The method of claim 16, wherein the predefined characteristic comprises a light output characteristic.

18. The method of claim 16, wherein the predefined characteristic comprises an electrical characteristic.

19. The method of claim 18, wherein the electrical characteristic comprises a forward bias voltage.

20. The method of claim 1, wherein the score lines define individual ones of the plurality of light emitting diodes.

* * * * *